US012603624B2

(12) United States Patent
Deng et al.

(10) Patent No.: US 12,603,624 B2
(45) Date of Patent: Apr. 14, 2026

(54) VARIABLE GAIN LOW NOISE AMPLIFIER AND METHOD FOR CONTROLLING GAIN OF VARIABLE GAIN LOW NOISE AMPLIFIER

(71) Applicant: MEDIATEK INC., Hsin-Chu (TW)

(72) Inventors: Zhiming Deng, San Jose, CA (US); Li Gao, San Jose, CA (US)

(73) Assignee: MEDIATEK INC., Hsinchu City (TW)

( * ) Notice: Subject to any disclaimer, the term of this patent is extended or adjusted under 35 U.S.C. 154(b) by 481 days.

(21) Appl. No.: 18/122,693

(22) Filed: Mar. 16, 2023

(65) Prior Publication Data

US 2023/0318556 A1 Oct. 5, 2023

Related U.S. Application Data

(60) Provisional application No. 63/325,620, filed on Mar. 31, 2022.

(51) Int. Cl.
H03F 3/16 (2006.01)
H03F 1/02 (2006.01)
(Continued)

(52) U.S. Cl.
CPC ......... H03G 3/3026 (2013.01); H03F 1/0244 (2013.01); H03F 3/2178 (2013.01); H03F 1/223 (2013.01); H03F 2200/294 (2013.01)

(58) Field of Classification Search
CPC .. H03G 3/3026; H03G 1/0088; H03G 3/3052; H03G 3/12; H03G 1/0052; H03G 1/007; H03G 3/3015; H03F 1/0244; H03F 3/2178; H03F 2200/294; H03F 2200/451;

H03F 2200/489; H03F 2200/492; H03F 2200/498; H03F 2203/7233; H03F 2203/7236; H03F 2203/7239;
(Continued)

(56) References Cited

U.S. PATENT DOCUMENTS 7,696,828 B2 * 4/2010 Chang ..................... H03F 1/223
330/311
8,102,213 B2 * 1/2012 Tasic ..................... H03F 1/3205
330/311
(Continued)

FOREIGN PATENT DOCUMENTS

WO 2007/085866 A1 8/2007

*Primary Examiner* — Khanh V Nguyen
(74) *Attorney, Agent, or Firm* — Winston Hsu

(57) ABSTRACT

A variable gain low noise amplifier (LNA) and a method for controlling a gain of the variable gain LNA are provided. The variable gain LNA may include a first transistor, a first degeneration inductor, a second transistor and a second degeneration inductor, wherein the first degeneration inductor is coupled to a source terminal of the first transistor, and the second degeneration inductor is coupled to a source terminal of the second transistor. Gate terminals of the first transistor and the second transistor are configured to receive an input signal. The first transistor and the first degeneration inductor belong to a first branch of the variable gain LNA, and the second transistor and the second degeneration inductor belong to a second branch of the variable gain LNA. More particularly, a gain of the variable gain LNA is determined by controlling whether to turn off the second branch.

19 Claims, 8 Drawing Sheets

(51) Int. Cl.
  *H03F 1/22*        (2006.01)
  *H03F 3/217*      (2006.01)
  *H03G 3/30*       (2006.01)

(58) Field of Classification Search
  CPC ........ H03F 1/3205; H03F 3/195; H03F 3/211;
          H03F 3/72; H03F 1/223; H03F 1/22;
        H03F 3/16; H03F 3/1935; H03F 3/193;
                          H03F 2200/372
  See application file for complete search history.

(56)                References Cited

U.S. PATENT DOCUMENTS

| | | | |
|---|---|---|---|
| 9,917,614 B1 * | 3/2018 | Kang | H03F 3/72 |
| 9,973,149 B2 | 5/2018 | Ayranci | |
| 10,038,418 B1 * | 7/2018 | Ayranci | H03G 1/0088 |
| 10,110,166 B1 | 10/2018 | Noori | |
| 10,320,350 B1 | 6/2019 | Leitner | |
| 10,389,305 B2 | 8/2019 | Lee | |
| 2011/0068871 A1 * | 3/2011 | Fujimoto | H03F 3/193 |
| | | | 330/277 |
| 2012/0249234 A1 | 10/2012 | Robert | |
| 2019/0158048 A1 * | 5/2019 | Medra | H03F 3/195 |
| 2019/0372528 A1 | 12/2019 | Pal | |

* cited by examiner

10

30

40

50

L0
L1
L2
L3
Routing wire

L0
L1
L2
L3
Routing wire

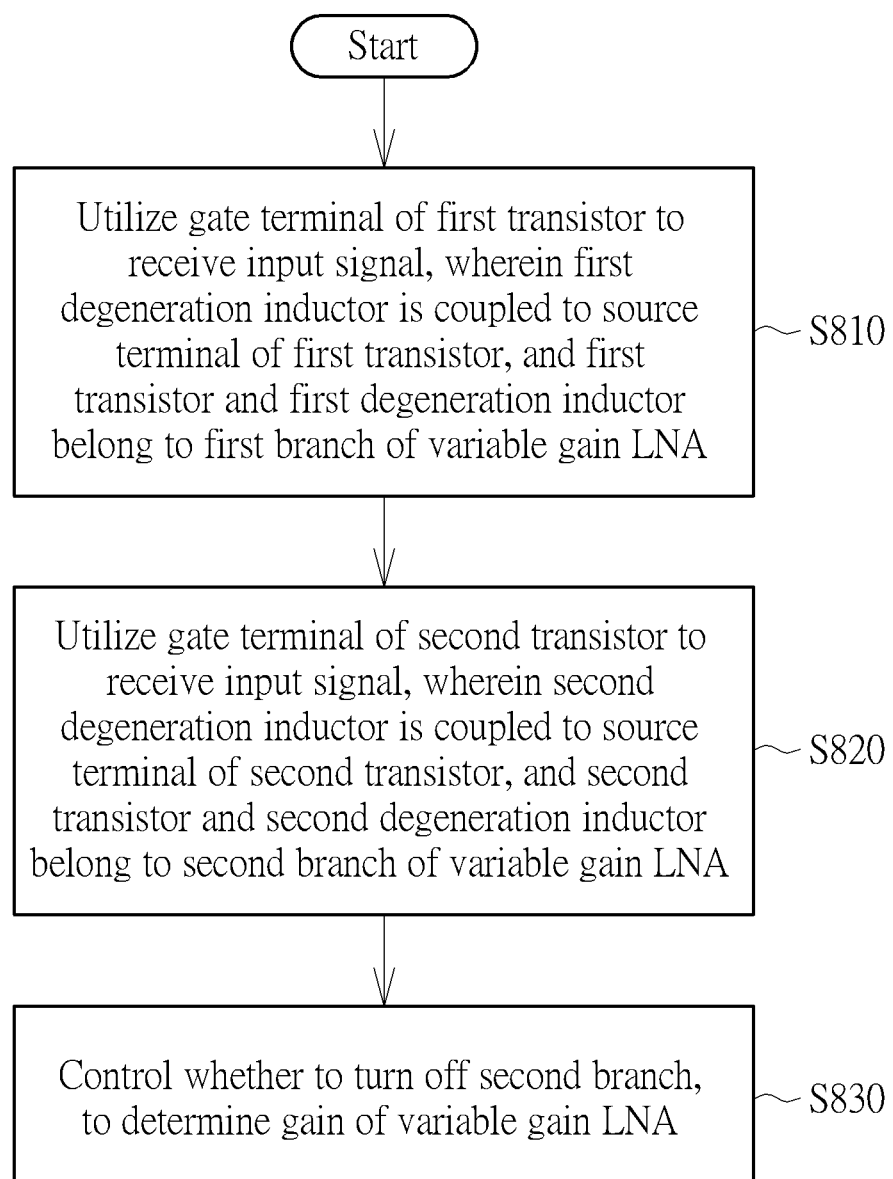

Start

Utilize gate terminal of first transistor to receive input signal, wherein first degeneration inductor is coupled to source terminal of first transistor, and first transistor and first degeneration inductor belong to first branch of variable gain LNA     ~S810

Utilize gate terminal of second transistor to receive input signal, wherein second degeneration inductor is coupled to source terminal of second transistor, and second transistor and second degeneration inductor belong to second branch of variable gain LNA     ~S820

Control whether to turn off second branch, to determine gain of variable gain LNA     ~S830

FIG. 8

VARIABLE GAIN LOW NOISE AMPLIFIER AND METHOD FOR CONTROLLING GAIN OF VARIABLE GAIN LOW NOISE AMPLIFIER

CROSS REFERENCE TO RELATED APPLICATIONS

This application claims the benefit of U.S. Provisional Application No. 63/325,620, filed on Mar. 31, 2022. The content of the application is incorporated herein by reference.

BACKGROUND

The present invention is related to low noise amplifiers (LNAs), and more particularly, to a variable gain LNA and a method for controlling a gain of the variable gain LNA.

For an LNA, certain architecture is proposed to optimize performances related to noise figure and gain step (e.g., gain tuning) stability in a related art. However, with this architecture, input matching and input linearity requirements become challenging. For example, parameters of components within the LNA are typically optimized under a condition where the LNA operates in a high gain mode, but input matching and input linearity of the LNA will degrade when the LNA operates in a low gain mode if these parameters are unchanged. In specific, even though the LNA is optimized under the high gain mode condition, when the LNA is switched to the low gain mode, input impedance of the LNA may change, which causes that the input matching condition is no longer optimized. In addition, as the input matching condition changes, the input linearity is thereby impacted.

One of related arts further implements an auxiliary amplifier which is optimized with respect to the low gain mode. However, an additional path provided by the auxiliary amplifier may introduce extra loading for overall architecture, and thereby impact the noise figure. In addition, tracking between two amplifiers may be required for a purpose of gain step stability, where the two amplifiers are independent, which makes the tracking be challenging.

Thus, there is a need for a novel architecture and related method, which can make the LNA properly operate at the optimized condition under all gain gears, or make the performance be less likely to degrade when the LNA operates in the low gain mode condition.

SUMMARY

An objective of the present invention is to provide a variable gain low noise amplifier (LNA) and a method for controlling a gain of the variable gain LNA, which can optimize the input matching condition and input linearity under all gain gears without introducing any side effect or in a way that is less likely to introduce side effects.

At least one embodiment of the present invention provides a variable gain LNA. The variable gain LNA may comprise a first transistor, a first degeneration inductor, a second transistor and a second degeneration inductor, wherein the first degeneration inductor is coupled to a source terminal of the first transistor, and the second degeneration inductor is coupled to a source terminal of the second transistor. Gate terminals of the first transistor and the second transistor are configured to receive an input signal. The first transistor and the first degeneration inductor belong to a first branch of the variable gain LNA, and the second transistor and the second degeneration inductor belong to a second branch of the variable gain LNA. More particularly, a gain of the variable gain LNA is determined by controlling whether to turn off the second branch.

At least one embodiment of the present invention provides a method for controlling a gain of a variable gain LNA. The method may comprise: utilizing a gate terminal of a first transistor to receive an input signal, wherein a first degeneration inductor is coupled to a source terminal of the first transistor, and the first transistor and the first degeneration inductor belong to a first branch of the variable gain LNA; utilizing a gate terminal of a second transistor to receive the input signal, wherein a second degeneration inductor is coupled to a source terminal of the second transistor, and the second transistor and the second degeneration inductor belong to a second branch of the variable gain LNA; and controlling whether to turn off the second branch, to determine a gain of the variable gain LNA.

The variable gain LNA and the method provided by the embodiments of the present invention not only slice the transistors, but also slice the degeneration inductors, which allows the input matching and the input linearity to be optimized over all gain gears. In addition, the embodiments of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a diagram illustrating a working flow of a method for controlling a gain of a variable gain LNA according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to .

.. ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
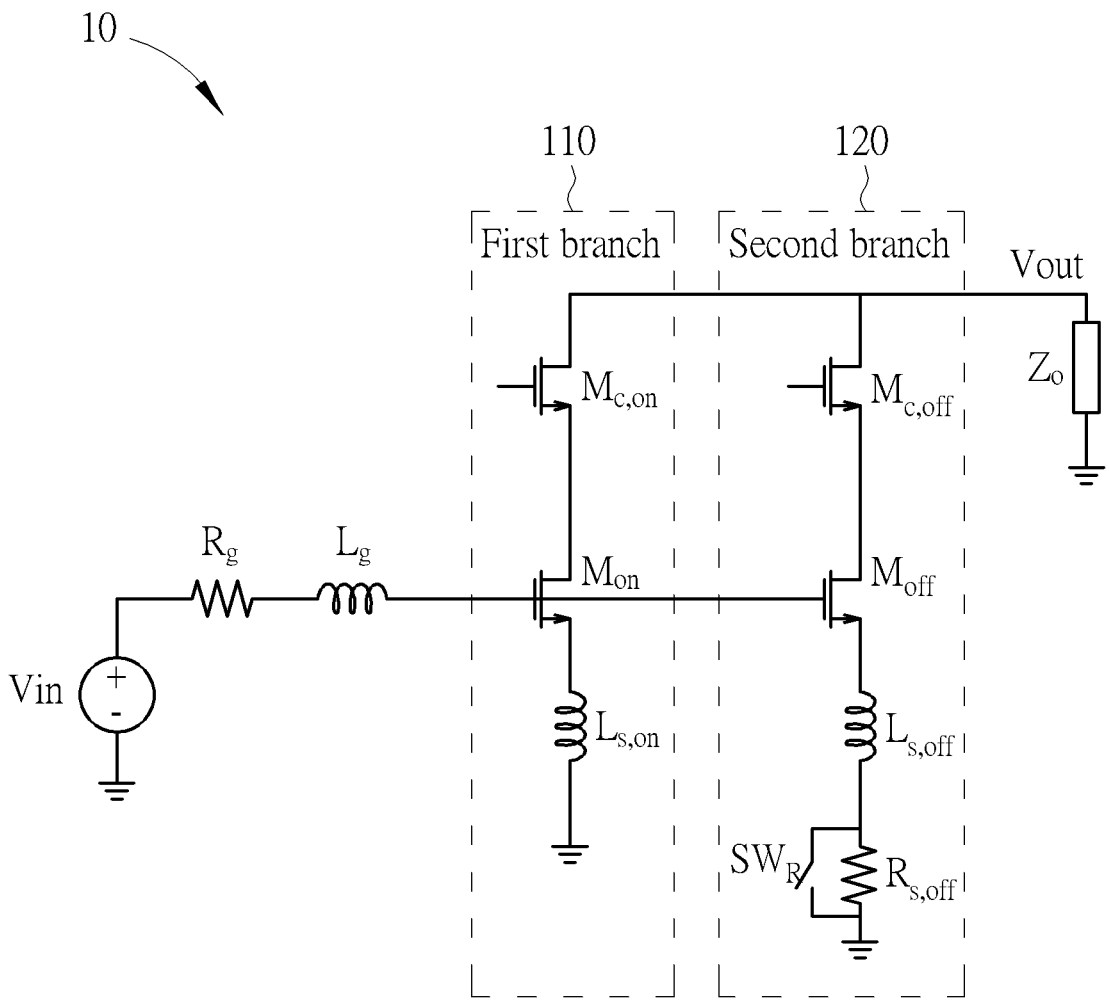
FIG. 1 is a diagram illustrating a variable gain low noise amplifier (LNA) according to an embodiment of the present invention.

FIG. 1 is a diagram illustrating a variable gain low noise amplifier (LNA) 10 according to an embodiment of the present invention. As shown in FIG. 1, the variable gain LNA 10 may comprise a first transistor such as a transistor $M_{on}$, a first degeneration inductor such as a degeneration inductor $L_{s,on}$, a second transistor such as a transistor $M_{off}$, and a second degeneration inductor such as a degeneration inductor $L_{s,off}$, where the degeneration inductor $L_{s,on}$ is coupled to a source terminal of the transistor $M_{on}$, and the degeneration inductor $L_{s,off}$ is coupled to a source terminal of the transistor $M_{off}$. In this embodiment, the variable gain LNA 10 may further comprise transistors $M_{c,on}$ and $M_{c,off}$ respectively coupled to drain terminals of the transistors $M_{on}$ and $M_{off}$ for a purpose of cascade stages, but the present invention is not limited thereto.

In this embodiment, gate terminals of the transistors $M_{on}$ and $M_{off}$ are configured to receive an input signal Vin. For example, the input signal Vin may be transmitted to the gate terminals of the transistors $M_{on}$ and $M_{off}$ via a resistor $R_g$ and an inductor $L_g$. The variable gain LNA 10 may generate an output signal Vout on an output load $Z_o$ according to the input signal Vin, and more particularly, may amplify the input signal with a gain of the variable gain LNA 10 to generate the output signal Vout. As shown in FIG. 1, the transistors $M_{c,on}$ and $M_{on}$ and the degeneration inductor $L_{s,on}$ belong to a first branch 110 of the variable gain LNA 10, and the transistors $M_{c,off}$ and $M_{off}$ and the degeneration inductor $L_{s,off}$ belong to a second branch 120 of the variable gain LNA 10, where the gain of the variable gain LNA 10 is determined by controlling whether to turn off the second branch 120. For example, the transistor $M_{c,on}$ may be configured to control whether to turn on or off the first branch 110, and the transistor $M_{c,off}$ may be configured to control whether to turn on or off the second branch 120. A gate terminal of the transistor $M_{c,on}$ may be fixed at a voltage level VH (e.g., a voltage level of a supply voltage VDD) to make the first branch 110 kept turned on, and a gate terminal of the transistor $M_{c,off}$ may be controlled to be either the voltage level VH or a voltage level VL (e.g., a voltage level of a ground voltage GND). When the gate terminal of the transistor $M_{c,off}$ is set at the voltage level VH, the second branch 120 is turned on. When the gate terminal of the transistor $M_{c,off}$ is set at the voltage level VL, the second branch 120 is turned off.

In this embodiment, the variable gain LNA 10 may further comprise a resistor $R_{s,off}$ and a switch $SW_R$, where the resistor $R_{s,off}$ is coupled to the degeneration inductor $L_{s,off}$, and the switch $SW_R$ is coupled across the resistor $R_{s,off}$. As shown in FIG. 1, the resistor $R_{s,off}$ and the switch $SW_R$ belong to the second branch 120, where the switch $SW_R$ may be controlled according to whether to turn off the second branch 120. For example, the switch $SW_R$ may be controlled by a control signal, wherein the control signal may indicate whether the second branch 120 is turned off or not. For example, when the second branch 120 is turned on (e.g., by setting the voltage level of the gate terminal of the transistor $M_{c,off}$ to the voltage level VH), the control signal may be pulled to the voltage level VH which may represent a first logic value (e.g., a logic value "1") to turn on the switch $SW_R$, and the resistor $R_{s,off}$ is therefore bypassed and does not take effect, making an effective source load of the transistor $M_{off}$ comprise the inductor $L_{s,off}$ only. When the second branch 120 is turned off (e.g., by setting the voltage level of the gate terminal of the transistor $M_{c,off}$ to the voltage level VL), the control signal may be pulled to the voltage level VL which may represent a second logic value (e.g., a logic value "0") to turn off the switch $SW_R$, and the resistor $R_{s,off}$ therefore takes effect, making the effective source load of the transistor $M_{off}$ comprise a network of the inductor $L_{s,off}$ and the resistor $R_{s,off}$ connected in series.

In general, the variable gain LNA 10 may comprise multiple branches, and any branch (e.g., each branch) of the multiple branches may comprise a cascode transistor (e.g., $M_{c,on}$ and $M_{c,off}$), an input transistor (e.g., $M_{on}$ and $M_{off}$) and a source degeneration inductor (e.g $L_{s,off}$) as illustrated by one of the first branch 110 and the second branch 120, and more particularly, each branch which is able to be selectively turned off may further comprise a resistor (e.g., $R_{s,off}$) and a switch (e.g., $SW_R$) as illustrated by the second branch 120. To better understand performance of the variable gain LNA 10 under different gain gears, assume that the first branch 110 represents an entirety of branches being turned on, and the second branch 120 represents an entirety of branches being turned off, where a percentage of turned-off branches among the multiple branches is $\alpha$. A transconductance introduced by the transistor $M_{off}$ is "$\alpha \times g_m$", a transconductance introduced by the transistor $M_{on}$ is "$(1-a) \times g_m$", a gate-to-source capacitance introduced by transistor $M_{off}$ is "$\alpha \times C_{gs}$", a gate-to-source capacitance introduced by transistor $M_{on}$ is "$(1-\alpha) \times C_{gs}$", the source degeneration inductor $L_{s,off}$ is "$L_s/\alpha$", and the source degeneration inductor $L_{s,on}$ is "$L_s/(1-\alpha)$", where "$g_m$" represents an overall transconductance of the variable gain LNA 10 based on a high gain mode (e.g., under a condition where all branches are turned on), "$C_{gs}$" represents an overall gate-to-source capacitance of the variable gain LNA 10 based on the high gain mode (e.g., a total capacitance introduced by the transistors $M_{on}$ and $M_{off}$ connected in parallel), and "$L_s$" represents an overall degeneration inductance of the variable gain LNA 10 based on the high gain mode (e.g., a total inductance introduced by the degeneration inductors $L_{s,on}$ and $L_{s,off}$ connected in parallel). Thus, a gain of the variable gain LNA 10 may be obtained as follows:

$$Gain = \frac{1-\alpha}{2} \times \left( \frac{Z_o}{j\omega L_s} \right)$$

In the above expression, "$\omega$" represents a frequency parameter, and "$j$" represents a unit imaginary number. By making a resistance of the resistor $R_{s,off}$ be "$(1/\alpha) \times (g_m \times L_s / C_{gs})$", an input impedance $Z_{in}$ of the variable gain LNA 10 can be obtained as follows:

$$Z_{in} = \frac{g_m L_s}{C_{gs}}$$

As shown above, the input impedance $Z_{in}$ does not contain the parameter a, which means the input impedance $Z_{in}$ can be substantially unchanged over different gain gears. When an input linearity of the variable gain LNA 10 is limited by a maximum output voltage $V_{o,MAX}$ of the output signal Vout, a maximum input voltage $V_{in,MAX,Vo-limited}$ which indicates the input linearity can be obtained as follows:

$$V_{in,MAX,Vo-limited} = \frac{2}{1-\alpha} \times \frac{1}{Z_o} \times j\omega L_s \times V_{o,MAX}$$

When the input linearity of the variable gain LNA 10 is limited by a maximum gate-to-source voltage $V_{gs,MAX}$ of the transistor $M_{on}$, a maximum input voltage $V_{in,MAX,Vgs\text{-}limited}$ which indicates the input linearity can be obtained as follows:

$$V_{in,MAX,Vo\text{-}limited} = 2 \times g_m \times j\omega L_s \times V_{gs,MAX}$$

Thus, an overall linearity of the variable gain LNA 10 may be represented by a minimum among the maximum input voltages $V_{in,MAX,Vo\text{-}limited}$ and $V_{in,MAX,Vgs\text{-}limited}$.

In view of above analysis, when parameters of components are designed for a purpose of optimizing performances (e.g., noise figure related performance, gain step stability, input matching, input linearity) of the variable gain LNA 10 operating in the high gain mode, input matching can be substantially kept at an optimized condition (e.g., having a S11 parameter equal or substantially equal to "−∞") over all gain gears. For example, the input matching can be substantially kept at an optimized condition when the variable gain LNA 10 operates in a low gain mode (e.g., a condition of the second branch 120 being turned off). Accordingly, the maximum input voltages $V_{in,MAX,Vo\text{-}limited}$ can be increased by 1 decibel (dB) in response to the gain of the variable gain LNA 10 being decreased by 1 dB, which substantially meets an ideal relationship between the maximum input voltages $V_{in,MAX,Vo\text{-}limited}$ and the gain of the variable gain LNA 10.

It should be noted that FIG. 1 takes two-branch architecture for illustrative purpose only, and is not meant to be a limitation of the present invention. Those skilled in this art should understand how to extend the concept illustrated by the embodiment of FIG. 1 to an architecture having more branches, and related details are omitted here for brevity.

Figure 2:
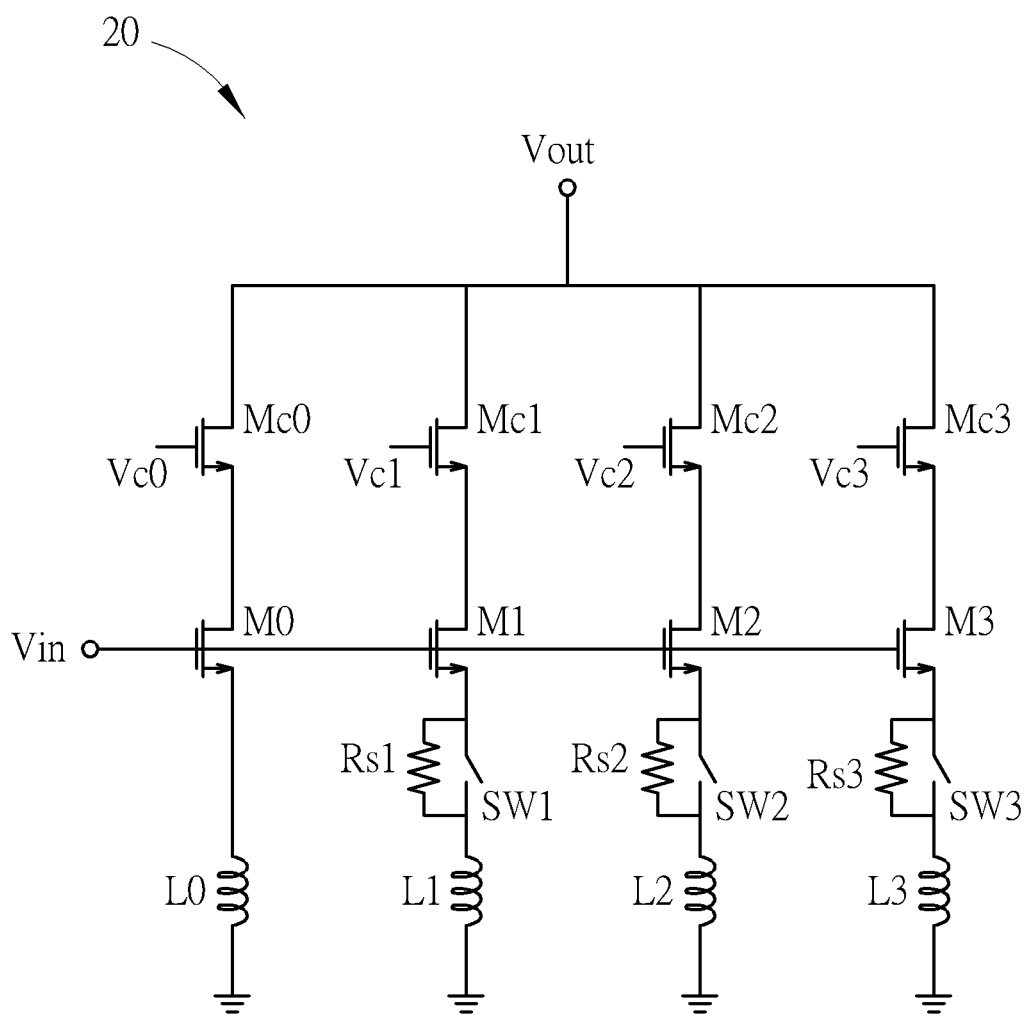
FIG. 2 is a diagram illustrating a variable gain LNA according to an embodiment of the present invention.

FIG. 2 is a diagram illustrating a variable gain LNA 20 according to an embodiment of the present invention, where the variable gain LNA 20 may be an example of the variable gain LNA 10 shown in FIG. 1. As shown in FIG. 2, the variable gain LNA 20 may comprise transistors Mc0, Mc1, Mc2, Mc3, M0, M1, M2 and M3, resistors Rs1, Rs2 and Rs3, switches SW1, SW2 and SW3, and degeneration inductors L0, L1, L2 and L3. For brevity, the resistor $R_g$, the inductor $L_g$ and the output load $Z_o$ are not shown in FIG. 2 for brevity. In this embodiment, a branch comprising the transistors Mc0 and M0, and the degeneration inductor L0 may be an example of the first branch 110 shown in FIG. 1. In addition, any (e.g., each) of a branch comprising the transistors Mc1 and M1, the resistor Rs1, the switch SW1 and the degeneration inductor L1, a branch comprising the transistors Mc2 and M2, the resistor Rs2, the switch SW2 and the degeneration inductor L2, and a branch comprising the transistors Mc3 and M3, the resistor Rs3, the switch SW3 and the degeneration inductor L3 may be an example of the second branch 120 shown in FIG. 1. More particularly, any of the switches SW1, SW2 and SW3 may be an example of the switch $SW_R$ shown in FIG. 1, where the switches SW1, SW2 and SW3 are connected in parallel with the resistors Rs1, Rs2 and Rs3, respectively, and gate terminals of the transistors Mc0, Mc1, Mc2 and Mc3 are controlled by control signals Vc0, Vc1, Vc2 and Vc3, respectively. As shown in FIG. 2, the switch SW1 is coupled between a source terminal of the transistor M1 and the degeneration inductor L1, where the switch SW1 is controlled according to whether to turn off the branch comprising the transistor M1 and the inductor L1 (e.g., according to whether the control voltage Vc1 is pulled down to the voltage level VL). The switch SW2 is coupled between a source terminal of the transistor M2 and the degeneration inductor L2, where the switch SW2 is controlled according to whether to turn off the branch comprising the transistor M2 and the inductor L2 (e.g., according to whether the control voltage Vc2 is pulled down to the voltage level VL). The switch SW3 is coupled between a source terminal of the transistor M3 and the degeneration inductor L3, where the switch SW3 is controlled according to whether to turn off the branch comprising the transistor M3 and the inductor L3 (e.g., according to whether the control voltage Vc3 is pulled down to the voltage level VL).

Figure 3:
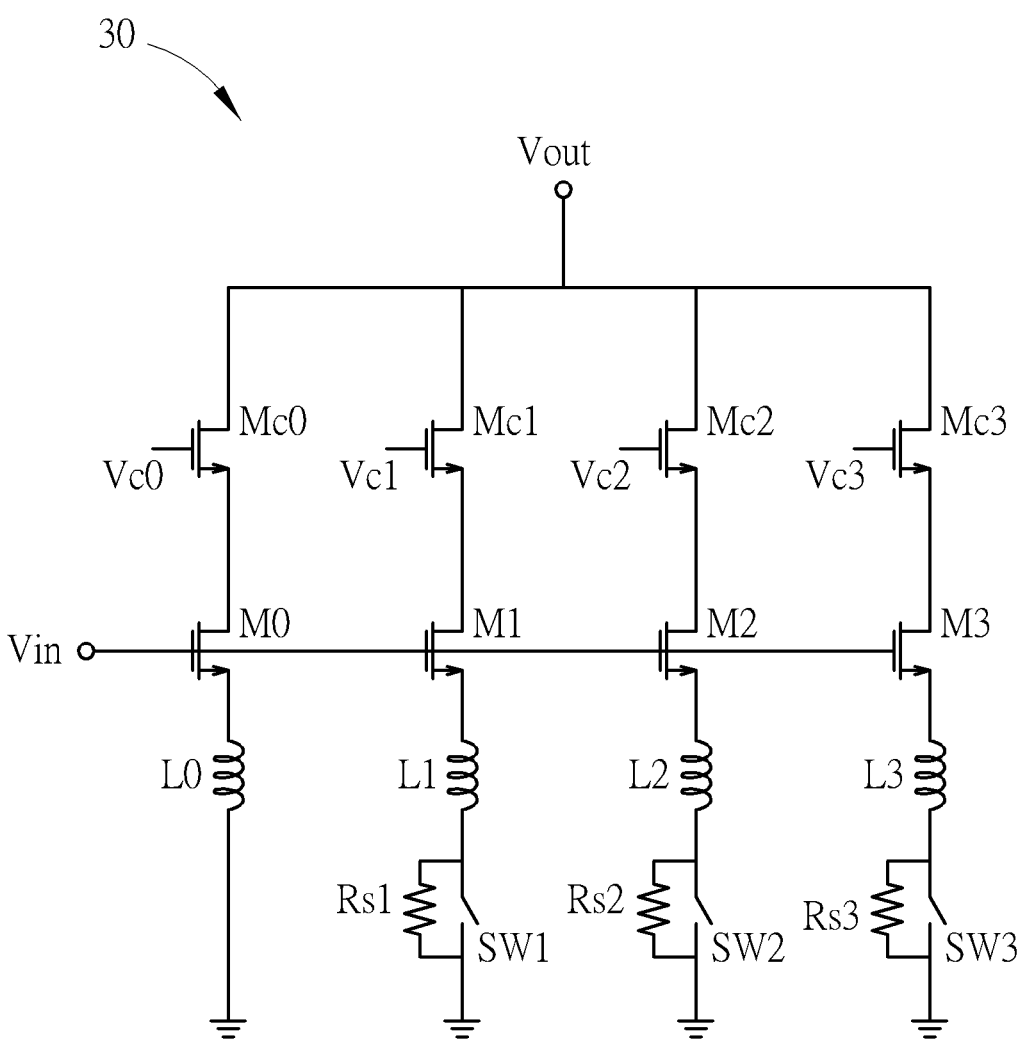
FIG. 3 is a diagram illustrating a variable gain LNA according to an embodiment of the present invention.

FIG. 3 is a diagram illustrating a variable gain LNA 30 according to an embodiment of the present invention, where the variable gain LNA 30 may be another example of the variable gain LNA 10 shown in FIG. 1, and more particularly, may be an alternative design with respect to the variable gain LNA 20 shown in FIG. 2. In the embodiment of FIG. 3, the switch SW1 and the resistor Rs1 are coupled between the degeneration inductor L1 and a reference terminal such as an alternating current (AC) ground terminal, where the switch SW1 is controlled according to whether to turn off the branch comprising the transistor M1 and the inductor L1 (e.g., according to whether the control voltage Vc1 is pulled down to the voltage level VL). The switch SW2 and the resistor Rs2 are coupled between the degeneration inductor L2 and the AC ground terminal, where the switch SW2 is controlled according to whether to turn off the branch comprising the transistor M2 and the inductor L2 (e.g., according to whether the control voltage Vc2 is pulled down to the voltage level VL). The switch SW3 and the resistor Rs3 are coupled between the degeneration inductor L3 and the AC ground terminal, where the switch SW3 is controlled according to whether to turn off the branch comprising the transistor M3 and the inductor L3 (e.g., according to whether the control voltage Vc3 is pulled down to the voltage level VL).

Figure 4:
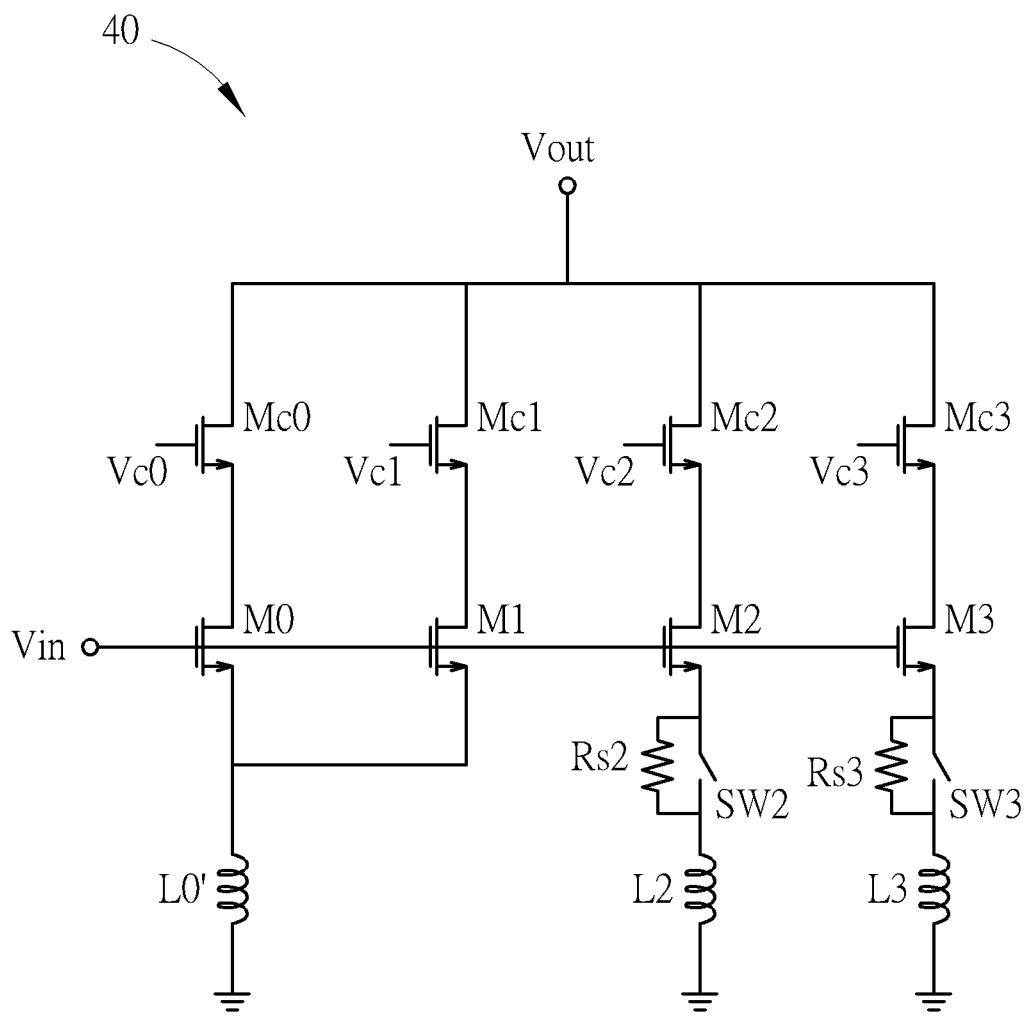
FIG. 4 is a diagram illustrating a variable gain LNA according to an embodiment of the present invention.

FIG. 4 is a diagram illustrating a variable gain LNA 40 according to an embodiment of the present invention, where the variable gain LNA 40 may be another example of the variable gain LNA 10 shown in FIG. 1, and more particularly, may be an alternative design with respect to the variable gain LNA 20 shown in FIG. 2. In the embodiment of FIG. 3, the degeneration inductors L0 and L1 may be combined to be one degeneration inductor such as L0', where the degeneration inductor L0' may be an example of the degeneration inductor $L_{s,on}$ shown in FIG. 1, and the transistor M0 may be an example of the transistor $M_{on}$ shown in FIG. 1. In addition, the variable gain LNA 40 may comprise a third transistor such as the transistor M1, where a gate terminal of the transistor M1 is configured to receive the input signal Vin, and the degeneration inductor L0' is coupled to a source terminal of the transistor M1.

Figure 5:
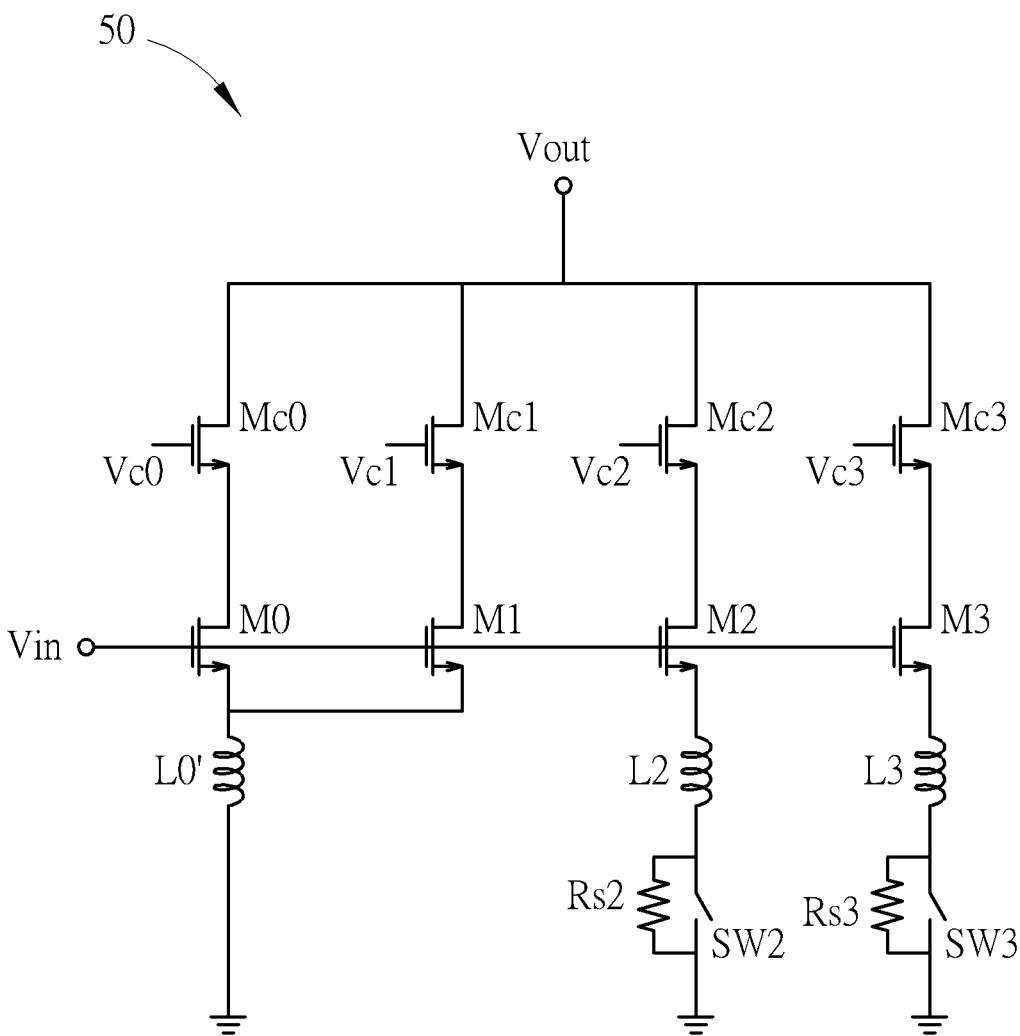
FIG. 5 is a diagram illustrating a variable gain LNA according to an embodiment of the present invention.

FIG. 5 is a diagram illustrating a variable gain LNA 50 according to an embodiment of the present invention, where the variable gain LNA 50 may be another example of the variable gain LNA 10 shown in FIG. 1, and more particularly, may be an alternative design with respect to the variable gain LNA 40 shown in FIG. 4. In the embodiment of FIG. 5, the switch SW2 and the resistor Rs2 are coupled between the degeneration inductor L2 and the AC ground terminal, where the switch SW2 is controlled according to whether to turn off the branch comprising the transistor M2 and the inductor L2 (e.g., according to whether the control voltage Vc2 is pulled down to the voltage level VL). The switch SW3 and the resistor Rs3 are coupled between the degeneration inductor L3 and the AC ground terminal, where the switch SW3 is controlled according to whether to turn off the branch comprising the transistor M3 and the inductor L3 (e.g., according to whether the control voltage Vc3 is pulled down to the voltage level VL).

Figure 6:
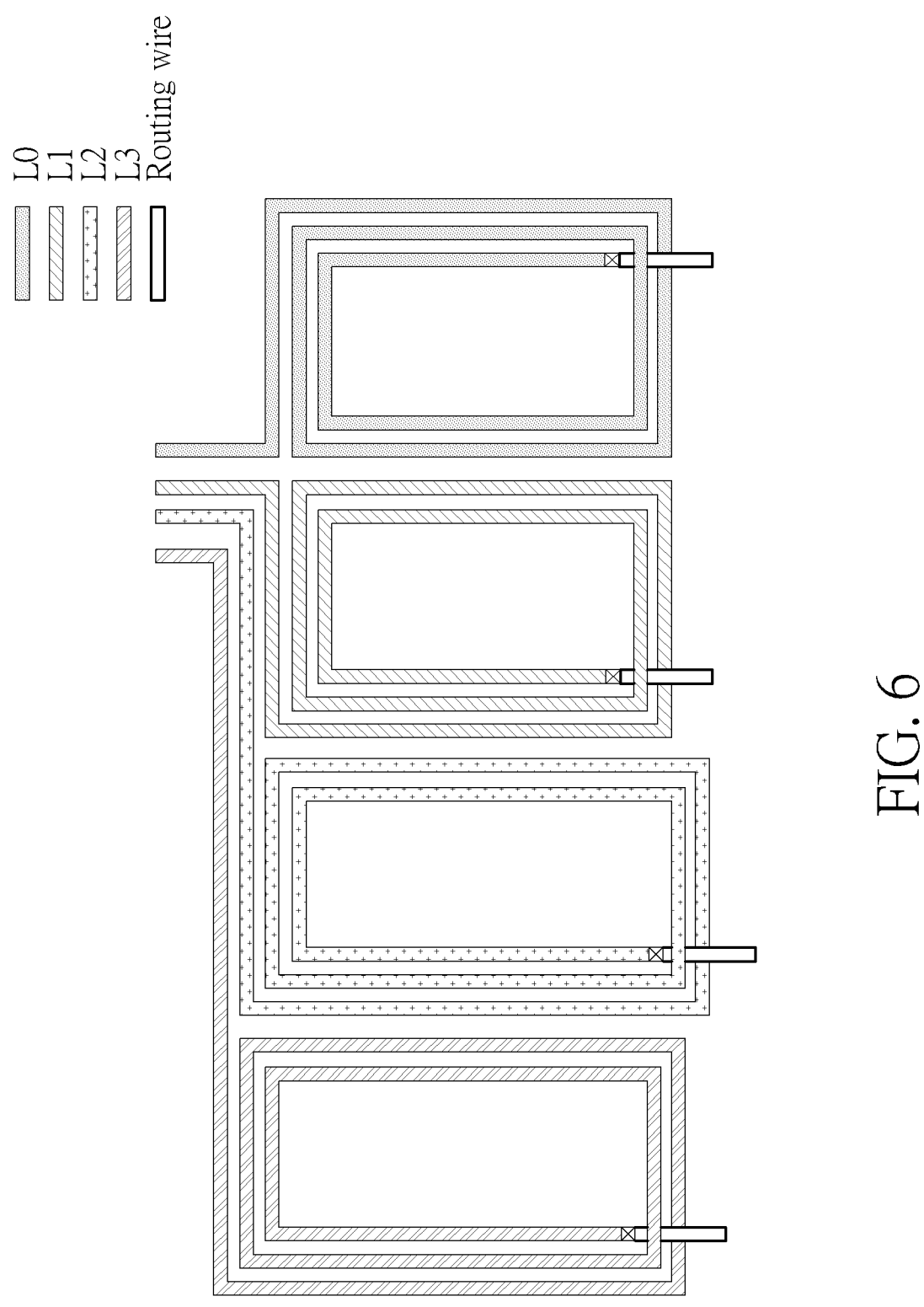
FIG. 6 is a diagram illustrating a layout of degeneration inductors according to an embodiment of the present invention.

FIG. 6 is a diagram illustrating a layout of degeneration inductors such as the degeneration inductors L0, L1, L2 and L3 mentioned in the previous embodiments according to an embodiment of the present invention. As shown in FIG. 6, a region surrounded by the degeneration inductor L0, a region surrounded by the degeneration inductor L1, a region surrounded by the degeneration inductor L2 and a region surrounded by the degeneration inductor L3 are non-over-lapping. In some embodiments, the degeneration inductors L0, L1, L2 and L3 may be implemented on the same metal layer. In some embodiments, the degeneration inductors L0, L1, L2 and L3 may be implemented on different metal layers. In this embodiment, any of the degeneration induc-tors L0, L1, L2 and L3 may be connected to at least one routing wire different from the metal layer thereof, but the present invention is not limited thereto.

Figure 7:
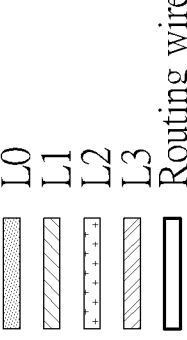
FIG. 7 is a diagram illustrating a layout of degeneration inductors according to another embodiment of the present invention.
Figure 7:
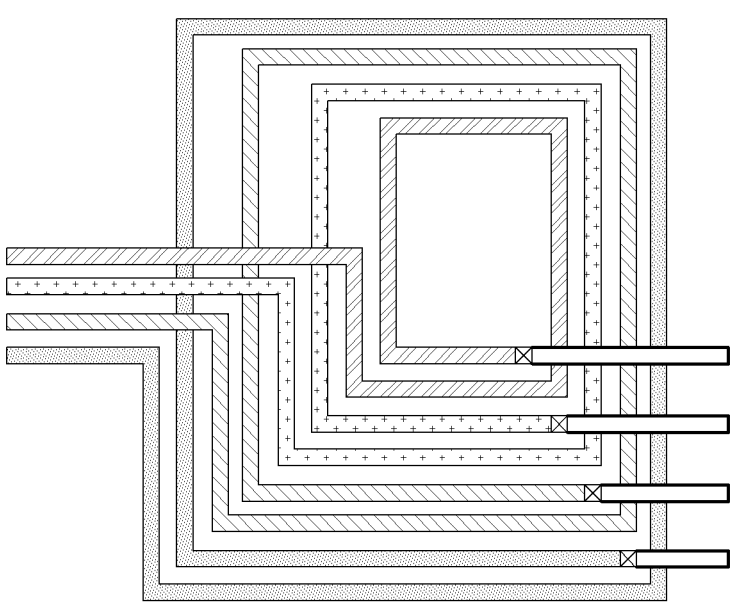

FIG. 7 is a diagram illustrating a layout of degeneration inductors such as the degeneration inductors L0, L1, L2 and L3 mentioned in the previous embodiments according to another embodiment of the present invention. As shown in FIG. 7, a region surrounded by the degeneration inductor L0, a region surrounded by the degeneration inductor L1, a region surrounded by the degeneration inductor L2 and a region surrounded by the degeneration inductor L3 overlaps one another. In practice, any two of the degeneration induc-tors L0, L1, L2 and L3 may have a mutual inductance among them, which needs to be considered during optimizing the matching condition mentioned above. In some embodi-ments, the degeneration inductors L0, L1, L2 and L3 may be implemented on the same metal layer. In some embodi-ments, the degeneration inductors L0, L1, L2 and L3 may be implemented on different metal layers. In this embodiment, any of the degeneration inductors L0, L1, L2 and L3 may be connected to at least one routing wire different from the metal layer thereof, but the present invention is not limited thereto.

FIG. 8 is a diagram illustrating a working flow of a method for controlling a gain of a variable gain LNA (e.g., the variable gain LNA 10 shown in FIG. 1) according to an embodiment of the present invention. It should be noted that the working flow shown in FIG. 8 is for illustrative purposes only, and is not meant to be a limitation of the present invention. One or more steps may be added, deleted or modified in the working flow shown in FIG. 8 if a same result can be obtained. In addition, these steps do not have to be executed in the exact order shown in FIG. 8.

In Step S810, the variable gain LNA may utilize a gate terminal of a first transistor (e.g., the transistor $M_{on}$) to receive an input signal, wherein a first degeneration inductor (e.g., the degeneration inductor $L_{s,on}$) is coupled to a source terminal of the first transistor, and the first transistor and the first degeneration inductor belong to a first branch of the variable gain LNA.

In Step S820, the variable gain LNA may utilize a gate terminal of a second transistor (e.g., the transistor $M_{off}$) to receive the input signal, wherein a second degeneration inductor (e.g., the degeneration inductor $L_{s,off}$) is coupled to a source terminal of the second transistor, and the second transistor and the second degeneration inductor belong to a second branch of the variable gain LNA.

In Step S830, the variable gain LNA may control whether to turn off the second branch, to determine the gain of the variable gain LNA. For example, the second branch may be turned on by controlling a voltage level of a gate terminal of a cascode transistor (e.g., the transistor $M_{c,off}$) belonging to the second branch to be the voltage level VH, and the second branch may be turned off by controlling the voltage level of the gate terminal of the cascode transistor belonging to the second branch to be the voltage level VL.

To summarize, the variable gain LNA and the method provided by the embodiments of the present invention not only slice the transistors, but also slice the degeneration inductors, which ensures that the input matching can be kept at the optimized condition, making the input linearity be optimized over all gain gears. In addition, the embodiments of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A variable gain low noise amplifier (LNA), comprising:
    a first transistor, wherein a gate terminal of the first transistor is configured to receive an input signal;
    a first degeneration inductor, coupled to a source terminal of the first transistor, wherein the first transistor and the first degeneration inductor belong to a first branch of the variable gain LNA;
    a second transistor, wherein a gate terminal of the second transistor is configured to receive the input signal; and
    a second degeneration inductor, coupled to a source terminal of the second transistor, wherein the second transistor and the second degeneration inductor belong to a second branch of the variable gain LNA;
    wherein a gain of the variable gain LNA is determined by controlling whether to turn off the second branch, and when the second branch is turned off, the second degeneration inductor is coupled between the source terminal of the second transistor and a resistor.

2. The variable gain LNA of claim 1, further comprising:
    a third transistor, wherein a gate terminal of the third transistor is configured to receive the input signal, and the first degeneration inductor is coupled to a source terminal of the third transistor.

3. The variable gain LNA of claim 1, wherein a region surrounded by the first degeneration inductor and a region surrounded by the second degeneration inductor are non-overlapping.

4. The variable gain LNA of claim 1, wherein a region surrounded by the first degeneration inductor overlaps a region surrounded by the second degeneration inductor.

5. A variable gain low noise amplifier (LNA), comprising:
    a first transistor, wherein a gate terminal of the first transistor is configured to receive an input signal;
    a first degeneration inductor, coupled to a source terminal of the first transistor, wherein the first transistor and the first degeneration inductor belong to a first branch of the variable gain LNA;
    a second transistor, wherein a gate terminal of the second transistor is configured to receive the input signal;
    a second degeneration inductor, coupled to a source terminal of the second transistor, wherein the second transistor and the second degeneration inductor belong to a second branch of the variable gain LNA;
    a resistor, coupled to the second degeneration inductor; and
    a switch, coupled across the resistor;

wherein a gain of the variable gain LNA is determined by controlling whether to turn off the second branch, and the switch is controlled according to whether to turn off the second branch.

6. The variable gain LNA of claim 5, wherein when the second branch is turned on, the switch is turned on.

7. The variable gain LNA of claim 5, wherein when the second branch is turned off, the switch is turned off.

8. The variable gain LNA of claim 5, wherein the switch is coupled between the source terminal of the second transistor and the second degeneration inductor.

9. The variable gain LNA of claim 5, wherein the switch is coupled between the second degeneration inductor and a reference terminal.

10. A method for controlling a gain of a variable gain low noise amplifier (LNA), comprising:

utilizing a gate terminal of a first transistor to receive an input signal, wherein a first degeneration inductor is coupled to a source terminal of the first transistor, and the first transistor and the first degeneration inductor belong to a first branch of the variable gain LNA;

utilizing a gate terminal of a second transistor to receive the input signal, wherein a second degeneration inductor is coupled to a source terminal of the second transistor, and the second transistor and the second degeneration inductor belong to a second branch of the variable gain LNA, wherein a switch and the source degeneration inductor are coupled in series to the source terminal of the second transistor;

controlling the switch according to whether to turn off the second branch; and controlling whether to turn off the second branch, to determine the gain of the variable gain LNA.

11. The method of claim 10, further comprising:

in response to the second branch being turned off, coupling the second degeneration inductor between the source terminal of the second transistor and a resistor.

12. The method of claim 10, wherein a resistor is coupled to the second degeneration inductor, and the switch is coupled across the resistor.

13. The method of claim 12, wherein controlling the switch according to whether to turn off the second branch comprises:

in response to the second branch being turned on, turning on the switch.

14. The method of claim 12, wherein controlling the switch according to whether to turn off the second branch comprises:

in response to the second branch being turned off, turning off the switch.

15. The method of claim 10, wherein the switch is coupled between the source terminal of the second transistor and the second degeneration inductor.

16. The method of claim 10, wherein the switch is coupled between the second degeneration inductor and a reference terminal.

17. The method of claim 10, further comprising:

utilizing a gate terminal of a third transistor to receive the input signal, wherein the first degeneration inductor is coupled to a source terminal of the third transistor.

18. The method of claim 10, wherein a region surrounded by the first degeneration inductor and a region surrounded by the second degeneration inductor are non-overlapping.

19. The method of claim 10, wherein a region surrounded by the first degeneration inductor overlaps a region surrounded by the second degeneration inductor.

\* \* \* \* \*